United States Patent
Hiyoshi

(10) Patent No.: US 9,881,996 B2
(45) Date of Patent: Jan. 30, 2018

(54) METHOD FOR MANUFACTURING SILICON CARBIDE SEMICONDUCTOR DEVICE AND SILICON CARBIDE SEMICONDUCTOR DEVICE

(71) Applicant: Sumitomo Electric Industries, Ltd., Osaka (JP)

(72) Inventor: Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/831,580

(22) Filed: Aug. 20, 2015

(65) Prior Publication Data

US 2016/0087032 A1    Mar. 24, 2016

(30) Foreign Application Priority Data

Sep. 24, 2014   (JP) ................. 2014-193764

(51) Int. Cl.
*H01L 21/76* (2006.01)
*H01L 29/06* (2006.01)
(Continued)

(52) U.S. Cl.
CPC ...... *H01L 29/0634* (2013.01); *H01L 21/0262* (2013.01); *H01L 21/02378* (2013.01);
(Continued)

(58) Field of Classification Search
CPC .................................................. H01L 21/76
(Continued)

(56) References Cited

U.S. PATENT DOCUMENTS

2007/0114602 A1*  5/2007  Saito ................... H01L 29/0619
                                                                 257/330
2008/0111207 A1*  5/2008  Lee ..................... H01L 29/0634
                                                                 257/496
(Continued)

FOREIGN PATENT DOCUMENTS

JP   2001-144292 A   5/2001
JP   2006-245082 A   9/2006
(Continued)

OTHER PUBLICATIONS

Tatsuhiko Fujihira, "Theory of Semiconductor Superjunction Devices," Jpn. J. Appl. Phys., vol. 36, pp. 6254-6262 (1997).

*Primary Examiner* — Marvin Payen
(74) *Attorney, Agent, or Firm* — Venable LLP; Michael A. Sartori; Tamatane J. Aga

(57) ABSTRACT

A method for manufacturing a silicon carbide semiconductor device includes the steps of preparing a silicon carbide substrate having a first main surface and a second main surface located on a side opposite to the first main surface, forming an epitaxial layer on the first main surface, the epitaxial layer having a first conductivity type and having a third main surface located on a side opposite to a side on which the silicon carbide substrate is located, forming a trench, which includes side walls intersecting with the third main surface and a bottom portion connected to the side walls, in the epitaxial layer, widening an opening of the trench, and forming an embedded region, which has a second conductivity type different from the first conductivity type, in the trench. The epitaxial layer adjacent to the embedded region and the embedded region constitute a superjunction structure.

5 Claims, 12 Drawing Sheets

(51) Int. Cl.
  *H01L 21/02*    (2006.01)
  *H01L 21/04*    (2006.01)
  *H01L 29/10*    (2006.01)
  *H01L 29/16*    (2006.01)
  *H01L 29/739*   (2006.01)
  *H01L 29/78*    (2006.01)
  *H01L 29/861*   (2006.01)
  *H01L 29/66*    (2006.01)
  *H01L 29/872*   (2006.01)

(52) U.S. Cl.
  CPC .. *H01L 21/02447* (2013.01); *H01L 21/02494* (2013.01); *H01L 21/02529* (2013.01); *H01L 21/02576* (2013.01); *H01L 21/02579* (2013.01); *H01L 21/02658* (2013.01); *H01L 21/0455* (2013.01); *H01L 21/0475* (2013.01); *H01L 29/1095* (2013.01); *H01L 29/1608* (2013.01); *H01L 29/66068* (2013.01); *H01L 29/7395* (2013.01); *H01L 29/7802* (2013.01); *H01L 29/861* (2013.01); *H01L 29/6606* (2013.01); *H01L 29/872* (2013.01)

(58) Field of Classification Search
  USPC .................. 257/76, 77, 79; 438/414–416
  See application file for complete search history.

(56) References Cited

U.S. PATENT DOCUMENTS

| | | | |
|---|---|---|---|
| 2012/0168856 A1* | 7/2012 | Luo | H01L 29/0634 257/330 |
| 2013/0075759 A1* | 3/2013 | Wada | H01L 21/0475 257/77 |

FOREIGN PATENT DOCUMENTS

| | | |
|---|---|---|
| JP | 2007-080971 A | 3/2007 |
| JP | 2008-305927 A | 12/2008 |
| JP | 2010-225831 A | 10/2010 |

\* cited by examiner

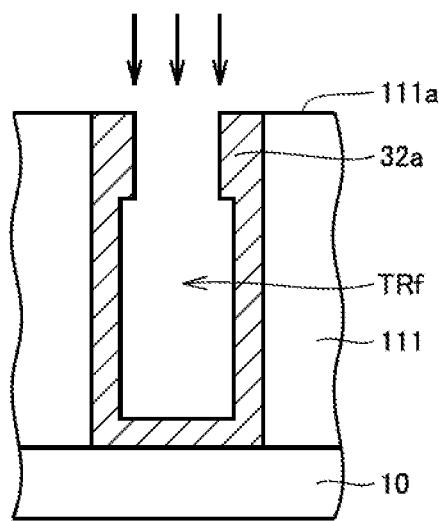
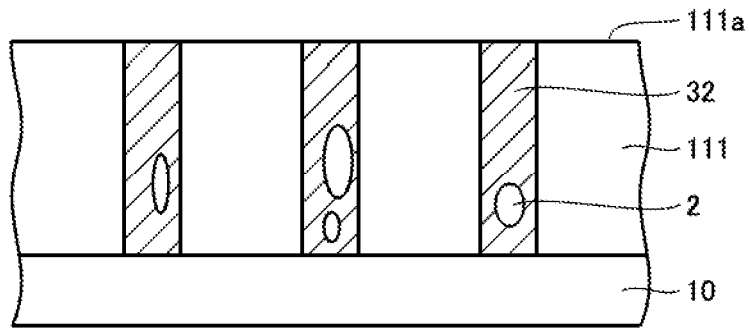

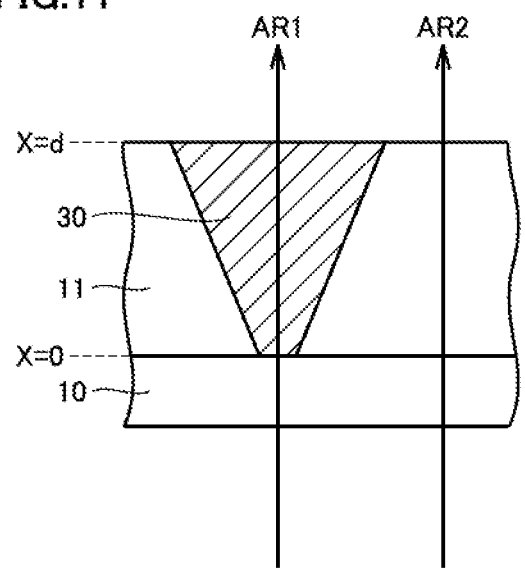
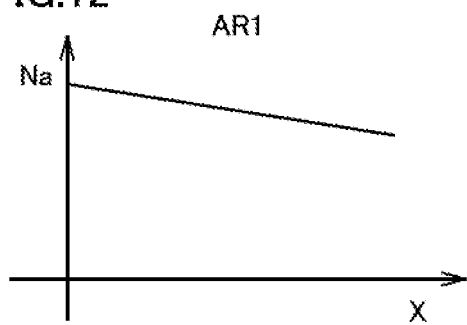

METHOD FOR MANUFACTURING SILICON CARBIDE SEMICONDUCTOR DEVICE AND SILICON CARBIDE SEMICONDUCTOR DEVICE

BACKGROUND OF THE INVENTION

Field of the Invention

The present invention relates to a method for manufacturing a silicon carbide semiconductor device, and a silicon carbide semiconductor device.

Description of the Background Art

Generally in a power semiconductor device (power device), a drift layer having a low impurity concentration and a large thickness ensures a breakdown voltage of the device. However, in this configuration, in order to reduce an on-resistance of the device, the impurity concentration must be increased in the drift layer, or the thickness of the drift layer must be decreased. In other words, as long as relying on the impurity concentration and thickness of the drift layer, the on-resistance and breakdown voltage of the device are in a trade-off relationship.

In order to overcome such a trade-off relationship, a superjunction structure (for example, refer to Jpn. J. Appl. Phys Vol 36 (1997) pp. 6254-6262) has been proposed for a power semiconductor device using silicon (Si). Originally, silicon carbide (SiC) is a material exhibiting a lower loss and higher breakdown voltage than Si. However, if further improvement in characteristics is sought, it can be considered to employ the superjunction structure also in the power semiconductor device using SiC (for example, refer to Japanese Patent Laying-Open No. 2001-144292).

SUMMARY OF THE INVENTION

In order to form a superjunction structure, it would be necessary to form columnar impurity regions periodically in a drift layer. According to Japanese Patent Laying-Open No. 2001-144292, a p-type impurity is ion-implanted into an n-type epitaxial layer, which becomes a drift layer, to form a superjunction structure. However, since an ion implantation depth to SiC is about 1 μm at most, deep ion implantation is difficult. Thus, in order to form the superjunction structure by this method, it would be necessary to repeat an operation of growing a thin epitaxial layer and ion implantation to stack impurity regions in multi-stages. Therefore, the productivity must be lowered.

Therefore, it can be considered to form a deep trench in an epitaxial layer and then form impurity regions (embedded regions) by an epitaxial regrowth in the trench. However, according to this method, voids (bubbles) remain in the impurity regions, and the reliability of the semiconductor device is lost. It will be described with reference to the drawings.

FIG. 5 is a schematic view illustrating an epitaxial regrowth in a trench. The epitaxial growth is performed, for example, by a CVD (Chemical Vapor Deposition) method involving addition of an impurity. Referring to FIG. 5, as a source material 32a is deposited by the CVD method into a trench TRf having side walls perpendicular to a main surface 111a of an epitaxial layer 111, a growth speed becomes faster near an inlet port (opening) of the trench than inside of the trench. This is because, while source material 32a is less likely to extend to a deep portion of the trench, abundant source material 32a is supplied near the inlet port of the trench. If the epitaxial growth is continued in this state, the opening is closed soon, and voids 2 remain in an embedded region 32, as shown in FIG. 6.

Hence, an object is to form a superjunction structure while suppressing generation of voids in a silicon carbide semiconductor device.

A method for manufacturing a silicon carbide semiconductor device according to one embodiment of the present invention comprises the steps of preparing a silicon carbide substrate having a first main surface and a second main surface located on a side opposite to the first main surface, forming an epitaxial layer on the first main surface, the epitaxial layer having a first conductivity type and having a third main surface located on a side opposite to a side on which the silicon carbide substrate is located, forming a trench, which includes side walls intersecting with the third main surface and a bottom portion connected to the side walls, in the epitaxial layer, widening an opening of the trench, and forming an embedded region, which has a second conductivity type different from the first conductivity type, in the trench. The epitaxial layer adjacent to the embedded region and the embedded region constitute a superjunction structure. The manufacturing method further includes the steps of forming an impurity region having the second conductivity type on the embedded region, forming a first electrode on the impurity region, and forming a second electrode in contact with the second main surface.

A silicon carbide semiconductor device according to one embodiment of the present invention includes a silicon carbide substrate having a first main surface and a second main surface located on a side opposite to the first main surface, an epitaxial layer formed on the first main surface, the epitaxial layer having a first conductivity type and having a third main surface located on a side opposite to a side on which the silicon carbide substrate is located, a trench which is formed in the epitaxial layer and includes side walls intersecting with the third main surface and a bottom portion connected to the side walls, and an embedded region, which is formed in the trench and has a second conductivity type different from the first conductivity type. In the silicon carbide semiconductor device, an opening of the trench is wider than the bottom portion, and the epitaxial layer adjacent to the embedded region and the embedded region constitute a superjunction structure. Further, the silicon carbide semiconductor device includes an impurity region formed on the embedded region and having the second conductivity type, a first electrode provided on the impurity region, and a second electrode in contact with the second main surface.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a partial cross sectional view schematically illustrating a process of forming an embedded region.

FIG. 6 is a partial cross sectional view schematically illustrating a process of forming an embedded region.

FIG. 11 is a schematic cross sectional view for explaining a concentration distribution of an impurity in an embedded region.

FIG. 12 is a graph representing a transition of a concentration of an impurity in a thickness direction of the embedded region of FIG. 11.

DESCRIPTION OF THE PREFERRED EMBODIMENTS

Figure 1:
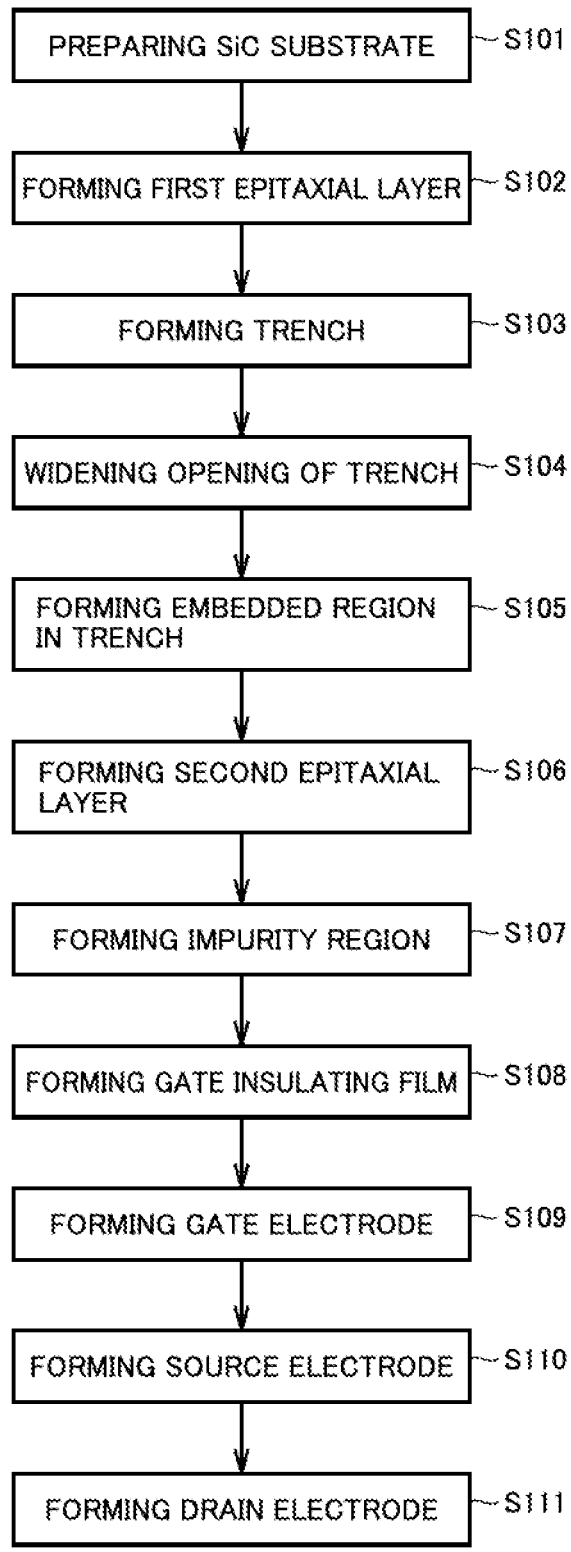
FIG. 1 is a flowchart schematically representing a method for manufacturing a silicon carbide semiconductor device according to one embodiment of the present invention.

Firstly, embodiments of the present invention will be described in a list. In the following description, the same or corresponding elements have the same reference characters, and the same description thereof will not be repeated. Moreover, in the crystallographic description of the present specification, an individual orientation is presented by [ ], and a group orientation is presented by < >, and an individual plane is presented by ( ), and a group plane is presented by { }, respectively. A negative index in the crystallography is generally expressed by adding "-" (bar) on a number. However, in the present specification, a negative reference character is given before a number to express a negative index in the crystallography.

[1] A method for manufacturing a silicon carbide semiconductor device according to one embodiment of the present invention includes the steps of preparing a silicon carbide substrate 10 having a first main surface 10a and a second main surface 10b located on a side opposite to first main surface 10a (S101), forming an epitaxial layer (first epitaxial layer 11) on first main surface 10a, the epitaxial layer having a first conductivity type and a third main surface 11a located on a side opposite to a side on which silicon carbide substrate 10 is located (S102), forming a trench TR, which includes side walls SW intersecting with third main surface 11a and a bottom portion BT connected to side walls SW, in the epitaxial layer (first epitaxial layer 11) (S103), widening an opening OP of trench TR (S104), and forming an embedded region 30, which has a second conductivity type different from the first conductivity type, in trench TR (S105). The epitaxial layer (first epitaxial layer 11) adjacent to embedded region 30 and embedded region 30 constitute a superjunction structure SJ. The manufacturing method further includes the steps of forming an impurity region (first impurity region 13) having the second conductivity type on embedded region 30 (S107), forming a first electrode 18 on the impurity region (first impurity region 13) (S110), and forming a second electrode 20 in contact with second main surface 10b (S11).

In the manufacturing method described above, when embedded region 30 is to be formed in trench TR, the step of widening opening OP of trench TR (S104) is performed in advance. Accordingly, when a source material which will be embedded region 30 is deposited in trench TR (S105), the source material widely extends from opening OP of trench TR to bottom portion BT, so that preceding of the crystal growth near opening OP, closing of opening OP, and remaining of voids inside of trench TR are prevented. Thus, according to this method, embedded region 30 which substantially does not include voids can be formed.

[2] In the step of widening an opening OP (S104), it is preferable that opening OP is widened so that side walls SW are inclined by greater than or equal to 45° and less than or equal to 80° with respect to third main surface 11a.

This is because there is a case where generation of voids cannot be suppressed sufficiently when an inclination angle of side walls SW exceeds 80°, and there is a case where refinement of the device becomes difficult when an inclination angle is below 45°.

[3] Preferably, embedded region 30 is formed such that a concentration of an impurity having the second conductivity type is reduced from bottom portion BT toward opening OP, and the epitaxial layer (first epitaxial layer 11) is formed such that a concentration of an impurity having the first conductivity type increases from first main surface 10a toward third main surface 11a.

Figure 22:
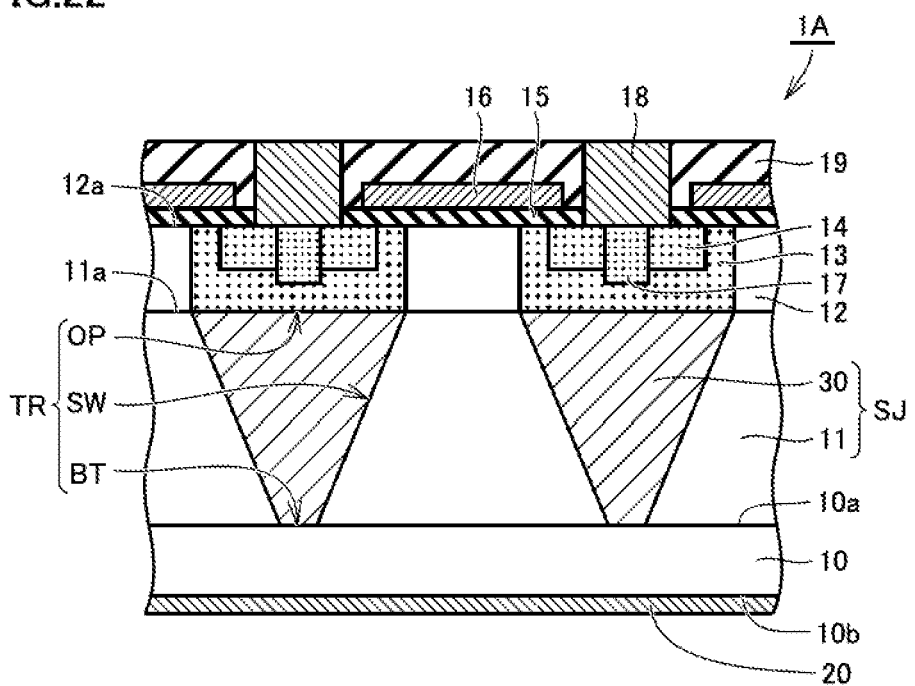
FIG. 22 is a partial cross sectional view schematically representing one example of a configuration of a silicon carbide semiconductor device according to one embodiment of the present invention.

Accordingly, even in a case where embedded region 30 is formed in trench TR having widened opening OP, first epitaxial layer 11 having the first conductivity type (for example, n-type) and embedded region 30 having the second conductivity type (for example, p-type) are depleted together in a wide range in a depth direction of trench TR at the time of application of a reverse bias, so that a depletion layer extending in a horizontal direction as shown in FIG. 22 can be formed. Therefore, even when an impurity concentration is increased in the drift layer (first epitaxial layer 11 and second epitaxial layer 12), the breakdown voltage of the device can be ensured, so that the low on-resistance and high breakdown voltage can stand together.

[4] Preferably, the step of forming a trench TR (S103) and the step of widening an opening OP (S104) are preformed simultaneously. For example, when trench TR is formed by thermal etching, these steps can be performed simultaneously. Moreover, also in the case where trench TR is formed by RIE (Reactive Ion Etching) or the like, these steps can be performed simultaneously. Accordingly, the productivity is improved.

[5] Preferably, trench TR is formed to extend along a <11-20> direction when viewed in a plan view.

Generally, silicon carbide substrate 10 has a predetermined off angle, and first epitaxial layer 11 is formed by a step-flow growth along the <11-20> direction. Thus, by forming trench TR along the <11-20> direction, the same plane orientation can appear in two side walls SW facing each other in trench TR. Accordingly, when embedded region 30 is formed by the epitaxial growth, a crystal growth occurs evenly in two side walls SW facing each other in trench TR, so that generation of voids is suppressed.

Herein, being viewed in a plan view represents a field of view for the SiC semiconductor device from a normal line direction of third main surface 11a.

[6] Preferably, in the above-described item [5], a plurality of trenches TR are formed in stripe. Accordingly, a plurality of embedded regions 30 can be formed, and multiplex superjunction structure SJ is formed, so that the breakdown voltage of the SiC semiconductor device can be further improved.

[7] A silicon carbide semiconductor device according to one embodiment of the present invention includes a silicon carbide substrate 10 having a first main surface 10a and a second main surface 10b located on a side opposite to first main surface 10a an epitaxial layer (first epitaxial layer 11) formed on first main surface 10a, the epitaxial layer having a first conductivity type and having a third main surface 11a located on a side opposite to a side on which silicon carbide substrate 10 is located, a trench TR which is formed in the epitaxial layer (first epitaxial layer 11) and includes side walls SW intersecting with third main surface 11a and a bottom portion BT connected to side walls SW, and an embedded region 30, which is formed in trench TR and has a second conductivity type different from the first conductivity type. In this silicon carbide semiconductor device, an opening OP of trench TR is wider than bottom portion BT, and the epitaxial layer (first epitaxial layer 11) adjacent to embedded region 30 and embedded region 30 constitute a superjunction structure SJ. The silicon carbide semiconductor device further includes an impurity region (first impurity region 13) formed on embedded region 30 and having the second conductivity type, a first electrode 18 provided on the impurity region (first impurity region 13), and a second electrode 20 in contact with second main surface 10b.

In this SiC semiconductor device, embedded region 30 is formed in trench TR having opening OP wider than bottom portion BT. Therefore, when embedded region 30 is to be formed, generation of voids can be reduced, and embedded region 30 which does not substantially include voids can be formed. Thus, this SiC semiconductor device is superior in the reliability while including superjunction structure SJ. Further, in this SiC semiconductor device, the low on-resistance and high breakdown voltage can stand together by superjunction structure SJ.

[8] Preferably, side walls SW are inclined by greater than or equal to 450 and less than or equal to 80° with respect to third main surface 11a. This is because generation of voids can be further reduced by setting an inclination angle of side walls SW to be less than or equal to 80°, and the device can be refined by setting the inclination angle to be greater than or equal to 45°.

[9] Preferably, a concentration of an impurity having the second conductivity type is reduced from bottom portion BT toward opening OP in embedded region 30, and a concentration of an impurity having the first conductivity type increases from first main surface 10a toward third main surface 11a in the epitaxial layer (first epitaxial layer 11).

Accordingly, at the time of application of a reverse bias, first epitaxial layer 11 adjacent to embedded region 30 and embedded region 30 can be depleted together in a wide range in the depth direction of trench TR. Therefore, even when the impurity concentration is increased in the drift layer (first epitaxial layer 11 and second epitaxial layer 12), the breakdown voltage of the device can be ensured, so that the low on-resistance and high breakdown voltage can stand together.

[10] Preferably, embedded region 30 is in contact with the impurity region (first impurity region 13). This is because an electric potential is readily fixed.

[11] Preferably, bottom portion BT is in contact with first main surface 10a. This is because the breakdown voltage is further improved.

[12] Preferably, trench TR extends along a <11-20> direction when viewed in a plan view. Forming trench TR to extend along the <11-20> direction as described above can further reduce generation of voids in embedded region 30.

[13] Preferably, a plurality of trenches TR and embedded regions 30 are provided, and the plurality of trenches TR and embedded regions 30 are in stripe. Forming multiplex superjunction structure SJ including a plurality of embedded regions 30 can further improve the breakdown voltage of the device.

Details of Embodiments of the Present Invention

Hereinafter, embodiments according to one aspect of the present invention (hereinafter, also referred to as "the present embodiment") will be described in detail, but the present embodiment is not limited to those. In the following, a MOSFET (Metal-Oxide-Semiconductor Field-Effect Transistor) will be described as an example. However, the present embodiment is not limited to this. For example, it may be widely applied to semiconductor devices having a vertical structure such as an SBD (Schottky Barrier Diode), a PiN diode, an IGBT (Insulated Gate Bipolar Transistor) a thyristor, a GTO (Gate Turn-Off thyristor), and the like. Further, a conductivity type of each region in the following description is merely one example, and a first conductivity type may be n-type or p-type (a second conductivity type different from the first conductivity type may be p-type or n-type).

First Embodiment: Method for Manufacturing Silicon Carbide Semiconductor Device

The first embodiment is a method for manufacturing an SiC semiconductor device FIG. 1 is a flowchart schematically representing a manufacturing method according to the first embodiment. Referring to FIG. 1, the manufacturing method includes the steps of preparing an SiC substrate (S101), forming a first epitaxial layer (S102), forming a trench (S103), widening an opening of the trench (S104), forming an embedded region in the trench (S105), forming a second epitaxial layer (S106), forming an impurity region (S107), forming a gate insulating film (S108), forming a gate electrode (S109), forming a source electrode (SI 10), and forming a drain electrode (S11).

In this manufacturing method, opening OP of trench TR is widened in advance (S104), and embedded region 30 is formed by an epitaxial regrowth in trench TR (S105). Accordingly, superjunction structure SJ can be formed while suppressing generation of voids. Hereinafter, each step will be described.

[Step of Preparing an SiC Substrate (S101)]

Figure 2:
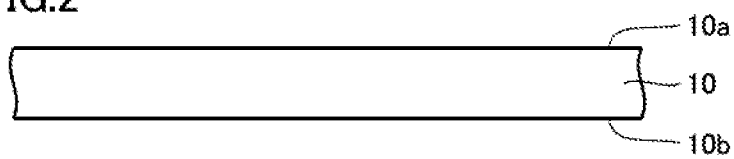
FIG. 2 is a partial cross sectional view schematically illustrating the step of preparing a silicon carbide substrate.

Referring to FIG. 2, SiC substrate 10 (wafer) having first main surface 10a and second main surface 10b is prepared. First main surface 10a is a crystal growth surface, and second main surface 10b is a so-called backside surface. SiC substrate 10 prepared, for example, by slicing a monocrystal ingot. For example, a wire saw is used for slicing. A polytype of SiC is desirably 4H—SiC. This is because it is superior in an electron mobility, a dielectric breakdown electric field strength, and the like.

A plane orientation of first main surface 10a as a crystal growth surface is, for example, a {0001} plane. Further, SiC substrate 10 desirably has an off angle of several degrees from the {0001} plane, in other words, first main surface 10a is inclined by several degrees from the {0001} plane. This is for performing a control of a polytype by the step-flow growth. An off angle of SiC substrate 10 is preferably greater than or equal to 1 and less than or equal to 8°, more preferably greater than or equal to 2° and less than or equal to 7°, particularly preferably greater than or equal to 3° and less than or equal to 5°. An off direction is, for example, a <11-20> direction.

[Step of Forming a First Epitaxial Layer (S102)]

Figure 3:
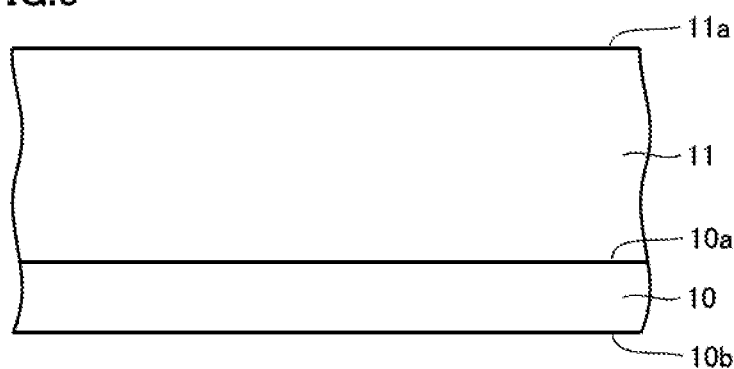
FIG. 3 is a partial cross sectional view schematically illustrating the step of forming a first epitaxial layer.

Referring to FIG. 3, first epitaxial layer 11 grows on first main surface 10a. First epitaxial layer 11 has third main surface 11a located on a side opposite to a side on which SiC substrate 10 is located.

First epitaxial layer 11 has a conductivity type (first conductivity type) of, for example, n-type. First epitaxial layer 11 grows, for example, by the CVD method. For example, using silane ($SiH_4$) and propane ($C_3H_8$) as source material gas and hydrogen ($H_2$) as carrier gas, the step-flow growth is performed along the <11-20> direction under the temperature of about 1400° C. to 1700° C. At this time, for example, nitrogen (N) or phosphorus (P) is introduced as an n-type impurity (dopant). Further, at this time, the impurity may be introduced such that its concentration increases from first main surface 10a toward third main surface 11a. It will be described later.

A thickness of first epitaxial layer 11 is, for example, about greater than or equal to 5 μm and less than or equal to 300 m, preferably greater than or equal to 10 μm and less than or equal to 250 μm, particularly preferably greater than or equal to 15 μm and less than or equal to 200 μm. This is because, in the present embodiment, a deep trench is formed in first epitaxial layer 11.

[Step of Forming a Trench (S103)]

Figure 4:
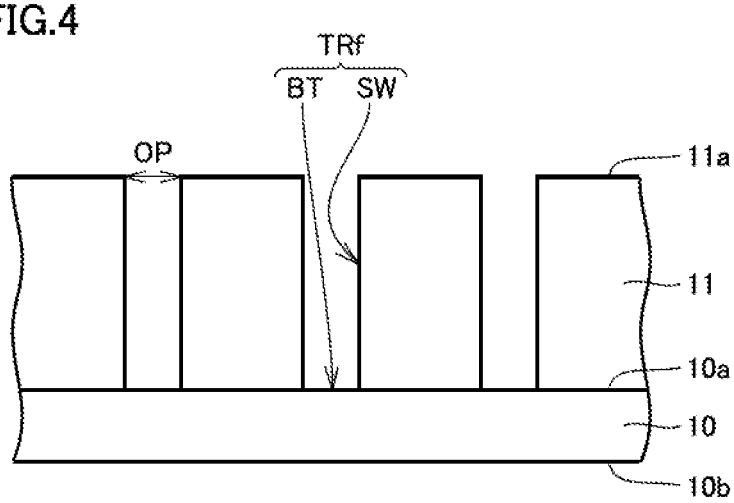
FIG. 4 is a partial cross sectional view schematically illustrating the step of forming a trench.

Referring to FIG. 4, a trench TRf is formed which includes side walls SW intersecting with third main surface 11a and a bottom portion BT connected to side walls SW. Trench TRf is formed, for example, by forming on third main surface 11a a mask having an opening at a portion where a trench should be formed, and performing etching though the mask, by a lithography method.

For example, RIE, particularly inductively coupled plasma (ICP)-RIE, can be used for etching. When the ICP-RIE is performed, for example, $SF_6$ gas, or mixed gas of $SF_6$ and $O_2$ can be used as reactive gas. According to such a method, trench TRf with opening OP and bottom portion BT having substantially the same width is formed. However, as will be described below, opening OP may be formed so as to be wider than bottom portion BT from an initial state.

[Step of Widening an Opening (S104)]

Figure 7:
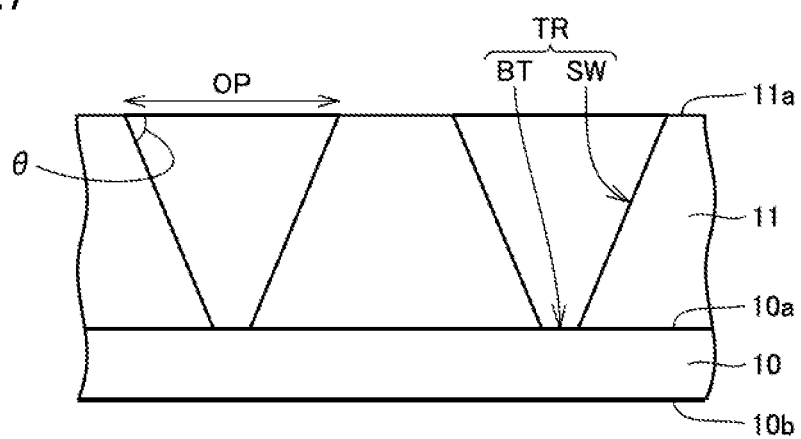
FIG. 7 is a partial cross sectional view schematically illustrating the step of widening an opening.

Referring to FIG. 7, opening OP of trench TRf is widened. Accordingly, trench TR having opening OP wider than bottom portion BT is formed. For example, thermal etching is suitable for such working. For example, by heating in reactive gas containing at least one kind of halogen atom, side walls SW are selectively etched, so that side walls SW can be inclined with respect to third main surface 11a. Herein, the reactivity gas is, for example, mixed gas of chlorine gas ($Cl_2$) and oxygen gas ($O_2$), and a heat treatment temperature is, for example, about higher than or equal to 700° C. and lower than or equal to 1000° C.

At this time, it is preferable to perform etching such that an inclination angle θ of side walls SW with respect to third main surface 11a becomes greater than or equal to 45° and less than or equal to 80°. This is because there is a case where refinement of the device becomes difficult when inclination angle θ is less than 45°, and generation of voids cannot be suppressed sufficiently when the inclination angle θ exceeds 80°. Inclination angle θ is preferably greater than or equal to 50° and less than or equal to 75°, particularly preferably greater than or equal to 55° and less than or equal to 70°, most preferably greater than or equal to 60° and less than or equal to 65°. This is because generation of voids can be suppressed assuredly while refining the device in such a range.

It should be noted that trench TR having widened opening OP can be formed from an initial state. In other words, in this case, the step of forming a trench (S103) and the step of widening an opening (S104) are performed simultaneously. Such an aspect simplifies the process and thus is suitable. For example, by appropriately adjusting a condition with thermal etching, trench TR can be formed while widening opening OP. Moreover, by appropriately adjusting a condition with use of RIE or the like, trench TR can be formed while widening opening OP.

Figure 14:
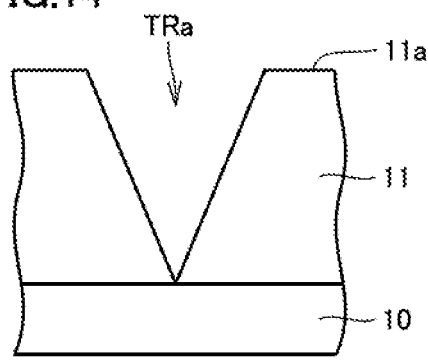
FIG. 14 is a partial cross sectional view schematically illustrating a first modification of the step of widening an opening.
Figure 15:
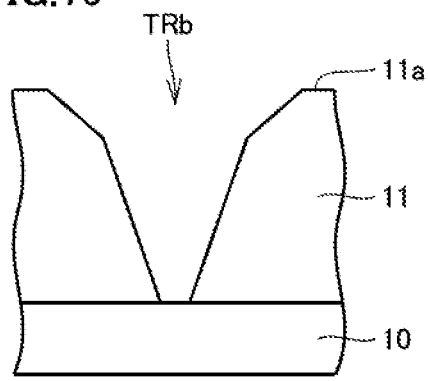
FIG. 15 is a partial cross sectional view schematically illustrating a second modification of the step of widening an opening.
Figure 16:
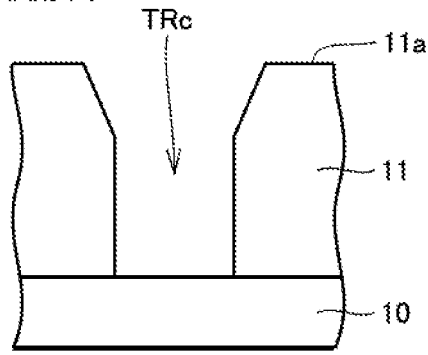
FIG. 16 is a partial cross sectional view schematically illustrating a third modification of the step of widening an opening.
Figure 17:
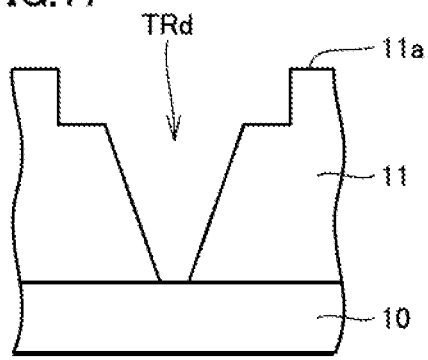
FIG. 17 is a partial cross sectional view schematically illustrating a fourth modification of the step of widening an opening.
Figure 18:
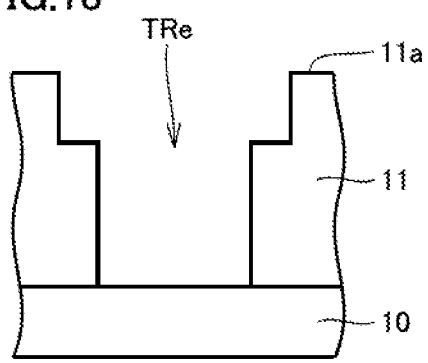
FIG. 18 is a partial cross sectional view schematically illustrating a fifth modification of the step of widening an opening.

From a view point of further reducing voids, it is preferable to set opening OP to be wider than a width of trench 1R at a central portion in a depth direction. However, it is all necessary to widen opening OP to be wider than bottom portion BT, and the cross-sectional shape of trench TR is not necessary to be an inverted trapezoidal shape as shown in FIG. 7. The cross-sectional shape of the trench may be, for example, a V-shape like a trench TRa shown in FIG. 14. Moreover, the cross-sectional shape of the trench may be set such that an inclination of side walls SW changes on the way from opening OP to bottom portion BT like a trench TRb and a trench TRc shown in FIGS. 15 and 16. Further, the cross-sectional shape of the trench may be set such that side walls SW of opening OP do not incline but are substantially vertical with respect to third main surface 11a like a trench TRd and a trench TRe shown in FIGS. 17 and 18.

A depth of trench TR is preferably greater than or equal to 1 μm and less than or equal to 150 μm, more preferably greater than or equal to 3 μm and less than or equal to 100 μm, particularly preferably greater than or equal to 5 μm and less than or equal to 50 μm. This is because superjunction structure SJ can be configured to exhibit a high breakdown voltage while suppressing generation of voids in such a range.

Figure 25:
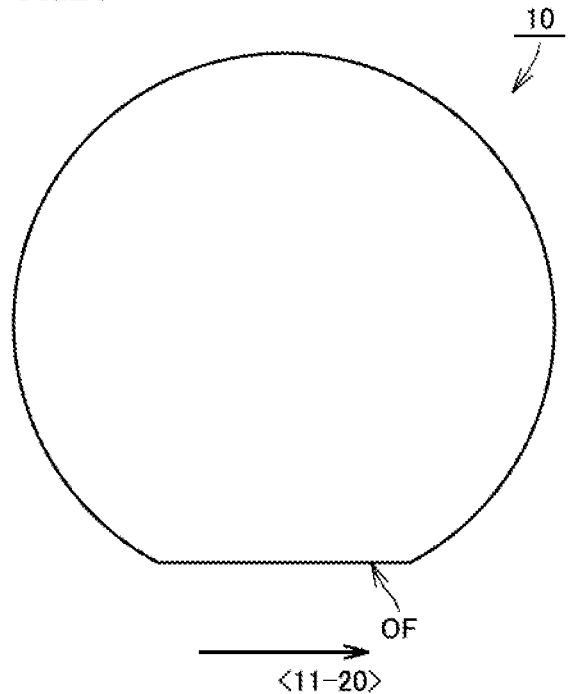
FIG. 25 is a plan view schematically representing one example of a configuration of a silicon carbide substrate.
Figure 26:
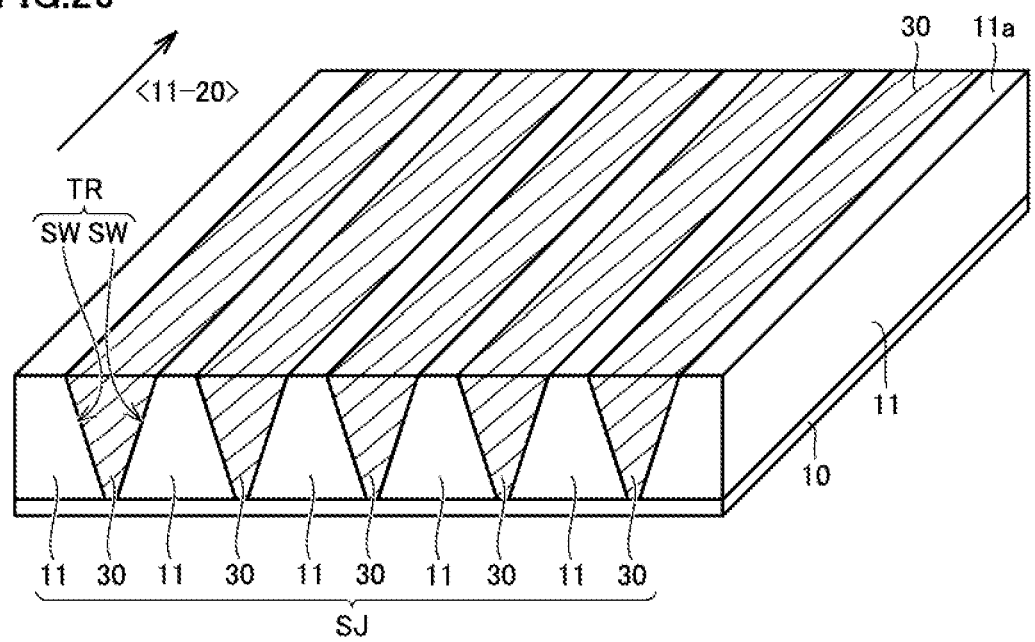
FIG. 26 is a schematic view representing one example of a superjunction structure.

Moreover, referring to FIG. 26, trench TR is preferably formed to extend along the <11-20> direction. This is because, when first epitaxial layer 11 is formed by the step-flow growth along the <11-20> direction as described above, by forming trench TR to extend along the <11-20> direction, the same plane orientation can appear in two side walls SW facing each other in trench TR. Then, by allowing the same orientation to appear on both of the side walls, a crystal can be epitaxially grown on the both side walls evenly, so that generation of voids can be suppressed. The <11-20> direction can be specified from an orientation flat OF of SiC substrate 10 (wafer), for example, with reference to FIG. 25.

Further, referring to FIG. 26, it is preferable to form a plurality of trenches TR in stripe. In the subsequent steps, embedded regions 30 can be formed in stripe, so that multiplex superjunction structure SJ constituted of a plurality of pn junctions can be formed.

[Step of Forming an Embedded Region in a Trench (S105)]

Figure 8:
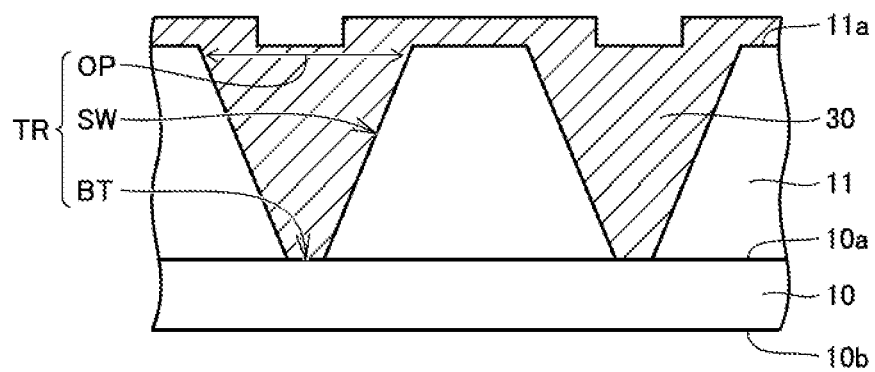
FIG. 8 is a partial cross sectional view schematically illustrating the step of forming an embedded region.

Referring to FIG. 8, embedded region 30 is formed in trench TR. Accordingly, first epitaxial layer 11 adjacent to embedded region 30 and embedded region 30 constitute superjunction structure SJ.

For example, embedded region 30 is formed by the epitaxial regrowth in trench TR. At this time, a p-type (a second conductivity type different from a first conductivity type) impurity is introduced into embedded region 30. The p-type impurity is, for example, aluminum (Al), boron (B), or the like. In the present embodiment, since opening OP is widened in advance, generation of voids is suppressed in the process of forming embedded region 30. It should be noted that, in FIG. 8, a portion of embedded region 30, which is generated in the process of the epitaxial growth and extends on main surface 11a and the like, may be removed, for example, by an MP (Mechanical Polishing), a CMP (Chemical Mechanical Polishing), or the like.

Herein, embedded region 30 is preferably formed such that a concentration of an impurity having a second conductivity type is reduced from bottom portion BT toward opening OP of trench TR, and first epitaxial layer 11 is preferably formed such that a concentration of an impurity having a first conductivity increases from first main surface 10a toward third main surface 11a. The reason will be described with reference to the drawings.

Figure 10:
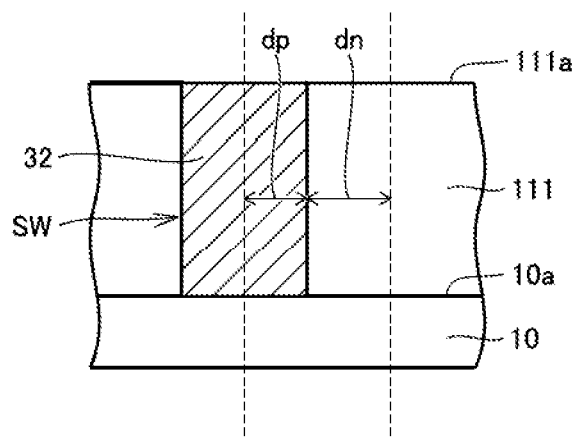
FIG. 10 is a schematic cross sectional view for explaining a concentration distribution of an impurity in an embedded region.

FIG. 10 is a schematic cross sectional view representing a configuration in which embedded region 32 is formed in a trench having side walls SW which are perpendicular to third main surface 11a. A distance dp in FIG. 10 represents a distance from a center of embedded region 32 to an interface (pn junction face) with an epitaxial layer 111, and a distance dn represents a distance from a center of a portion of epitaxial layer 111 paired with embedded region 32 in the superjunction structure to an interface with embedded region 30.

Herein, when the concentration of the impurity of embedded region 32 is Na, and the concentration of the impurity of epitaxial layer 111 is Nd, and the following expression (i) Na–dp=Nd×dn is satisfied, the number of electric charges in the p-type region (embedded region 32) and the n-type region (epitaxial layer 111) become equal in the horizontal direction, so that the p-type region and the n-type region can be completely depleted at the time of applying the inverse bias. Since the depletion layer formed in such a manner restricts a current in the superjunction structure, the breakdown voltage can be maintained even when the concentration of the impurity of the drift layer (epitaxial layer 111) is increased.

Figure 9:
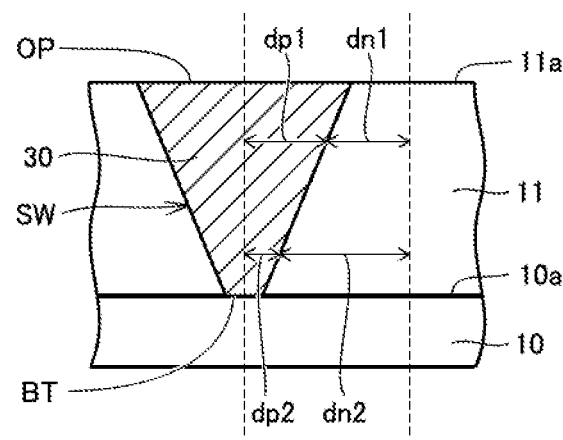
FIG. 9 is a schematic cross sectional view for explaining a concentration distribution of an impurity in an embedded region.

Next, referring to FIG. 9, the case will be considered where embedded region 30 is opened in a tapered manner toward third main surface 11a. In this case, in the thickness direction of embedded region 30, a distance corresponding to dp described above becomes longer from bottom portion BT toward opening OP as indicated by dp1 and dp2 in FIG. 9. Similarly, in the thickness direction of first epitaxial layer 11, a distance corresponding to dn described above becomes shorter from first main surface 10a toward third main surface 11a as indicated by dn1 and dn2 in FIG. 9. Thus, when the concentration of the impurity in embedded region 30 and first epitaxial layer 11 is constant throughout the thickness direction, a portion having unbalanced electric charges may occur in the p-type region and the n-type region, so that the p-type region or the n-type region cannot be depleted completely in that portion.

Therefore, embedded region 30 is formed such that the concentration of the p-type (second conductivity type) impurity is reduced from bottom portion BT toward opening OP, and first epitaxial layer 11 is formed such that the concentration of the n-type (first conductivity type) impurity increases from first main surface 10a toward third main surface 11a. Accordingly, the above-described expression (i) is satisfied in a wide range in the thickness direction of first epitaxial layer 11, so that high breakdown voltage can be maintained.

Figure 13:
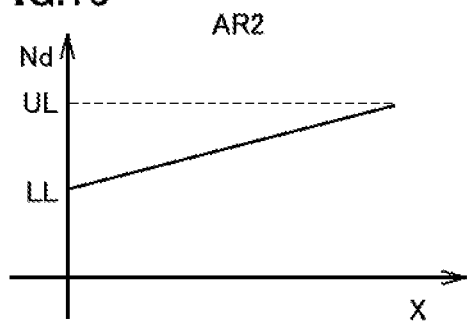
FIG. 13 is a graph representing a transition of a concentration of an impurity in a thickness direction of the epitaxial layer of FIG. 11.

The concentration of the impurity in embedded region 30 and first epitaxial layer 11 may be changed in stages or continuously. Preferably, it is changed continuously. FIG. 12 represents one example of a continuous change in the concentration of the impurity on an arrow AR1 in FIG. 11, and FIG. 13 represents one example of a continuous change in the concentration of the impurity on an arrow AR2 in FIG. 11. When the concentration of the impurity is changed continuously in each region in such a manner, the expression (i) described above can be satisfied throughout the thickness direction of first epitaxial layer 11, for example. Therefore, with such an embodiment, the breakdown voltage can be further increased.

Herein, from a view point of the on-resistance, in FIG. 13, a lower limit value ILL of the concentration of the impurity in first epitaxial layer 11 is preferably greater than or equal to $1 \times 10^{14}$ cm$^{-3}$, more preferably greater than or equal to $2 \times 10^{14}$ cm$^{-3}$, particularly preferably $3 \times 10^{14}$ cm$^{-3}$ and an upper limit value UL is, for example, less than or equal to $5 \times 10^{15}$ cm$^{-3}$.

[Step of Forming a Second Epitaxial Layer (S106)]

Figure 19:
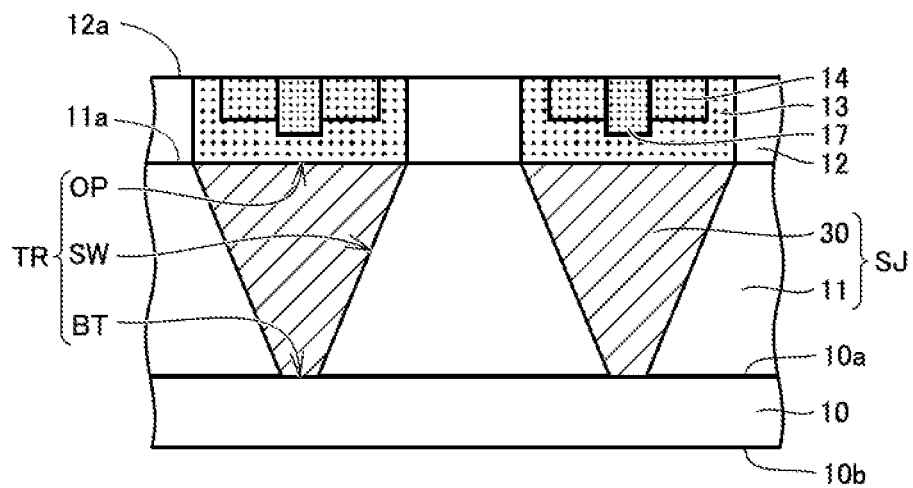
FIG. 19 is a partial cross sectional view schematically illustrating the step of forming an impurity region.

Referring to FIG. 19, second epitaxial layer 12 is formed on embedded region 30. Second epitaxial layer 12 has a fourth main surface 12a located on a side opposite to a side on which first epitaxial layer 11 is located. The thickness of second epitaxial layer 12 is, for example, about greater than or equal to 0.5 μm and less than or equal to 5 μm.

[Step of Forming an Impurity Region (S107)]

Referring to FIG. 19, for example by an ion-implantation method through an implantation mask, a p body region 13 (first impurity region) having a p-type conductivity (second conductivity type), an n$^+$ region 14 (second impurity region) having an n-type conductivity type, and a p$^+$ region 17 (third impurity region) having a p-type conductivity type are formed in second epitaxial layer 12 and on embedded region 30.

[Step of Forming Gate Insulating Film (S108)]

Figure 20:
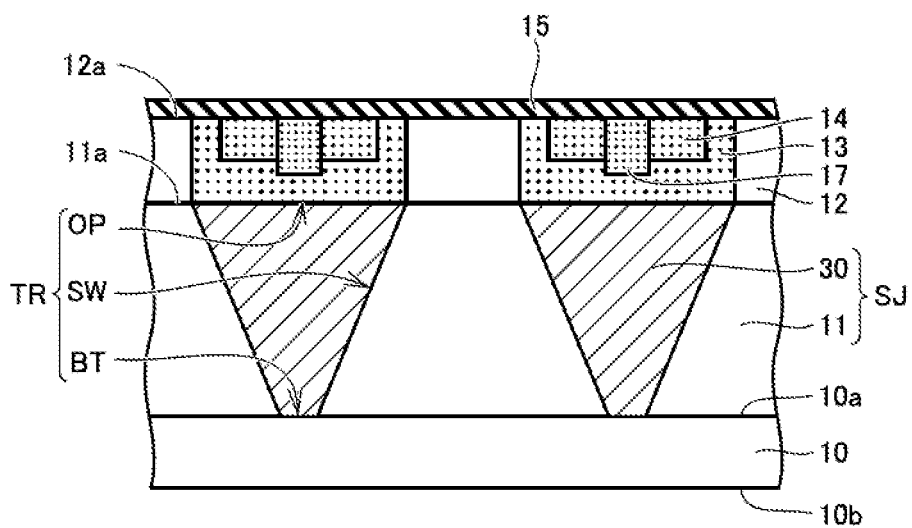
FIG. 20 is a partial cross sectional view schematically illustrating the step of forming a gate insulating film.

Referring to FIG. 20, gate insulating film 15 is formed on second epitaxial layer 12. Gate insulating film 15 can be formed, for example, by thermal oxidation. For example, by heating second epitaxial layer 12 under an oxygen atmosphere at a temperature of 1300° C., gate insulating film 15 as a silicon oxide (SiO$_2$) film can be formed.

[Step of Forming Gate Electrode (S109)]

Figure 21:
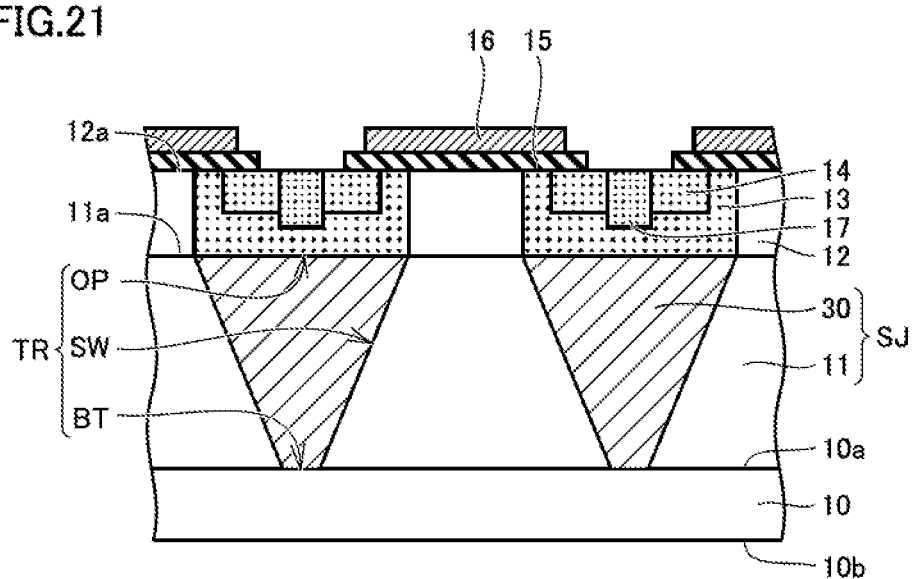
FIG. 21 is a partial cross sectional view schematically illustrating the step of forming a gate electrode.

Referring to FIG. 21, gate electrode 16 is formed on gate insulating film 15. Gate electrode 16 is formed, for example, by the CVD method or the like. Gate electrode 16 is constituted of, for example, polysilicon or the like.

[Step of Forming a Source Electrode (First Electrode) (S110)]

Referring to FIG. 22, interlayer insulating film 19 is formed firstly so as to cover gate electrode 16. Next, etching is performed so as to expose n$^+$ region 14 and p$^+$ region 17. Source electrode 18 (first electrode) is formed on exposed n$^+$ region 14 and p$^+$ region 17 (in other words, on p body region 13). Source electrode 18 is formed, for example, by a sputtering method or the like. Source electrode 18 is constituted of, for example, nickel (Ni), titanium (Ti), Al, or the like.

[Step of Forming Drain Electrode (Second Electrode) (S111)]

Referring to FIG. 22, drain electrode 20 (second electrode) in contact with second main surface 10b of SiC substrate 10 is formed. Drain electrode 20 is formed, for example, by the sputtering method or the like. Drain electrode 20 is constituted of, for example, NiSi alloy or the like.

By performing the steps described above, an SiC semiconductor device 1A having reduced voids in a superjunction structure can be manufactured.

Second Embodiment: Silicon Carbide Semiconductor Device

The second embodiment is an SiC semiconductor device. FIG. 22 is a partial cross sectional view schematically representing one example of a configuration of an SiC semiconductor device according to the second embodiment. An SiC semiconductor device 1A is a vertical MOSFET, and can be typically manufactured by the first embodiment described above.

Referring to FIG. 22, SiC semiconductor device 1A includes an SiC substrate 10 having a first main surface 10a and a second main surface 10b located on a side opposite to first main surface 10a, and a first epitaxial layer 11 formed on first main surface 10a, having an n-type (first conductivity type), and having a third main surface 11a located on a side opposite to a side on which SiC substrate 10 is located.

In first epitaxial layer 11, trench TR is formed which includes side walls SW intersecting third main surface 11a and bottom portion BT connected to side walls SW. Side walls SW are inclined with respect to third main surface 11a. Consequently, opening OP of trench TR is wider than bottom portion BT. Embedded region 30 having a p-type (second conductivity type) is formed in trench TR. First epitaxial layer 11 adjacent to embedded region 30 and embedded region 30 constitute superjunction structure SJ.

In SiC semiconductor device 1A, a high breakdown voltage can be exhibited by superjunction structure SJ while increasing the concentration of the impurity of first epitaxial layer 11. Further, since opening OP of trench TR is wider than bottom portion BT, generation of voids is reduced in embedded region 30 at the time of forming embedded region 30. Therefore, SiC semiconductor device 1A is also superior in the reliability.

Herein, referring to FIG. 26, SiC semiconductor device 1A preferably includes multiplex superjunction structure SJ constituted of a plurality of trenches TR and embedded regions 30. This is because the breakdown voltage of the device is improved. Moreover, at this time, it is preferable that trenches TR and embedded region 30 are formed in stripe and extend along the <11-20> direction. This is because generation of voids is further reduced at the time of forming embedded region 30.

Moreover, as described above, side walls SW of trench TR are inclined by greater than or equal to 45° and less than or equal to 80° with respect to third main surface 11a. This is because the device can be refined while reducing voids in this range. Further, preferably, the concentration of the impurity having a p-type (second conductivity type) is reduced from bottom portion BT toward opening OP in embedded region 30, and the concentration of the impurity having n-type (first conductivity type) increases from first main surface 10a to third main surface 11a in first epitaxial layer 11. This is for depleting both the p-type region and n-type region in superjunction structure SJ.

Second epitaxial layer 12 is formed on first epitaxial layer 11 and embedded region 30. Second epitaxial layer 12 has a fourth main surface 12a located on a side opposite to a side on which first epitaxial layer 11 is located. First epitaxial layer 11 and second epitaxial layer 12 serve as drift layers. The concentration of the impurity in second epitaxial layer 12 is, for example, about greater than or equal to $1\times10^{14}$ cm$^{-3}$ and less than or equal to $10^{16}$ cm$^{-3}$.

P body region 13 (first impurity region), n region 14 (second impurity region), and p$^+$ region 17 (third impurity region) are formed in second epitaxial layer 12. P body region 13 includes a p-type (second conductivity type) impurity. The concentration of the impurity in p body region 13 is, for example, about $5>10^{17}$ cm$^{-3}$.

N$^+$ region 14 includes an n-type (first conductivity type) impurity. The concentration of the impurity in n$^+$ region 14 is set to be higher than the concentration of the impurity in second epitaxial layer 12 (a part of the drift layer). The concentration of the impurity in n$^+$ region 14 is, for example, about $1\times10^{20}$ cm$^{-3}$.

P$^+$ region 17 includes a p-type impurity. The concentration of the impurity in p$^+$ region 17 is set to be higher than the concentration of the impurity in p body region 13. The concentration of the impurity in p$^+$ region 17 is, for example, about greater than or equal to $2\times10^{18}$ cm$^{-3}$ and less than or equal to $1\times10^{20}$ cm$^{-3}$.

Source electrode 18 (first electrode) is in contact with n$^+$ region 14 and p$^+$ region 17, and is in ohmic contact with those. In other words, the first electrode is formed on the impurity region. On the surface (fourth main surface 12a) of second epitaxial layer 12, gate insulating film 15 is formed at a portion which is not in contact with source electrode 18. Further, gate electrode 16 is formed on gate insulating film 15. Accordingly, a portion of p body region 13 which is located below gate electrode 16 and sandwiched between n$^+$ region 14 and second epitaxial layer 12 can form a channel region. A current passing through the channel region is controlled by a voltage applied to gate electrode 16.

Gate electrode 16 and source electrode 18 are insulated by an interlayer insulating film 19. Drain electrode 20 (second electrode) is formed in contact with second main surface 10b of SiC substrate 10 and is in ohmic contact with SiC substrate 10.

First Modification

Figure 23:
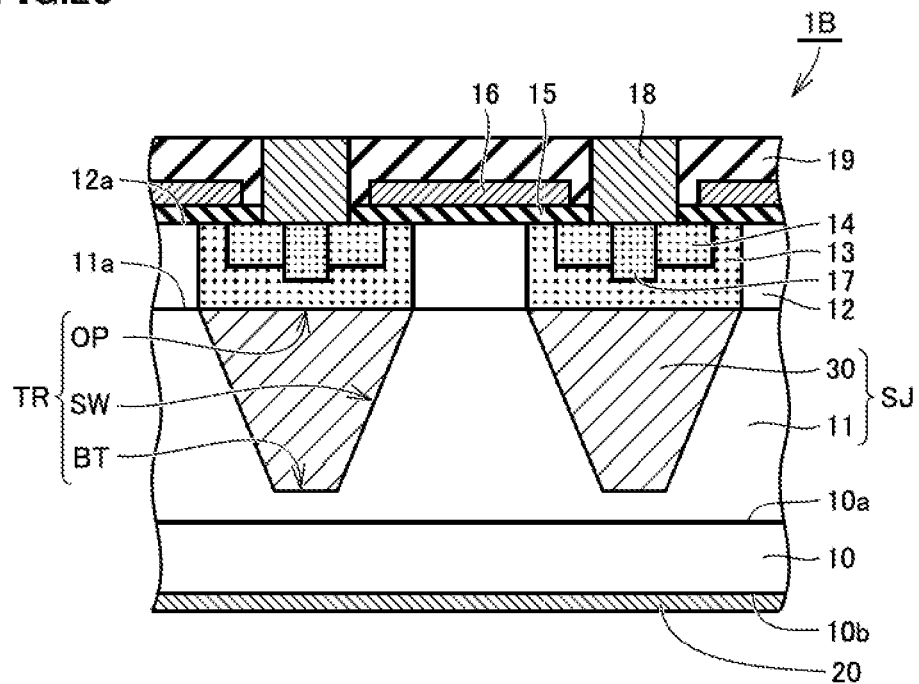
FIG. 23 is a partial cross sectional view schematically representing a first modification of the silicon carbide semiconductor device.

Referring to FIG. 23, in an SiC semiconductor device 1B which is a first modification of the present embodiment, bottom portion BT of trench TR (embedded region 30) is not in contact with first main surface 10a. Even with such a configuration, embedded region 30 may be in a state of not substantially including voids as long as opening OP of trench TR is wider than bottom portion BT. Therefore, the high reliability can be exhibited while allowing the low on-resistance and the high breakdown voltage to stand together by means of superjunction structure SJ. However, more preferably, bottom portion BT of trench TR is in contact with first main surface 10a as shown in FIG. 22. This is because, in first epitaxial layer 11, a depletion layer can be formed which extends in a horizontal direction in a wider range so that the breakdown voltage is further improved.

Second Modification

Figure 24:
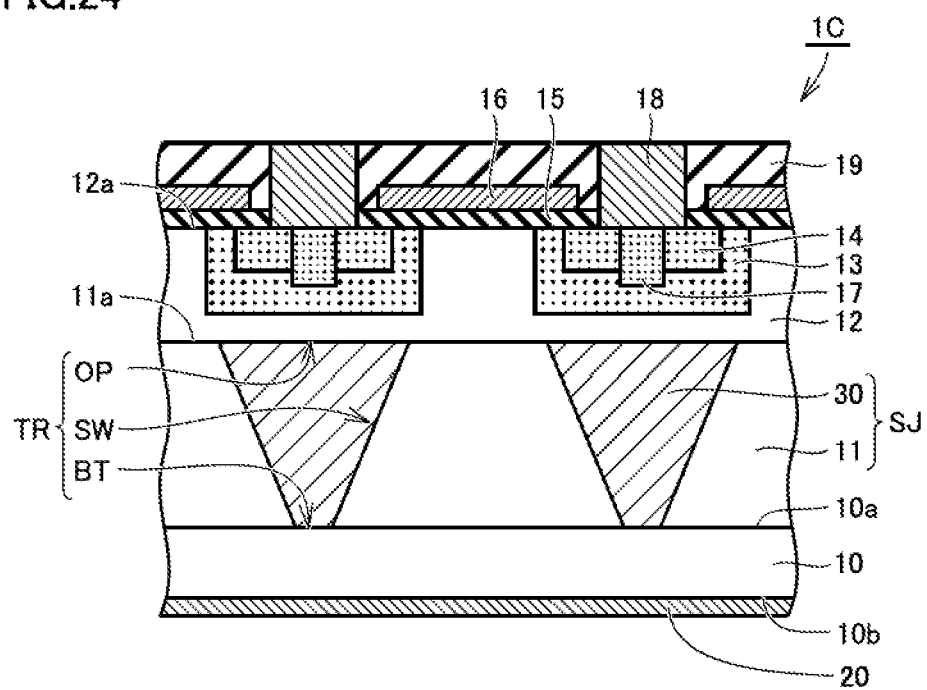
FIG. 24 is a partial cross sectional view schematically representing a second modification of the silicon carbide semiconductor device.

Referring to FIG. 24, in an SiC semiconductor device 1C which is a second modification of the present embodiment, embedded region 30 and p body region 13 (first impurity region) are formed to be separated from each other. Embedded region 30 may be in a state of not substantially including voids as long as opening OP of trench TR is wider than bottom portion BT. Therefore, the high reliability can be exhibited while allowing the low on-resistance and the high breakdown voltage to stand together by means of superjunction structure SJ. However, more preferably, as with SiC semiconductor device 1A shown in FIG. 22, embedded region 30 is in contact with p body region 13 (first impurity region). This is because connecting embedded region 30 to p body region 13 is likely to cause an electric potential to be fixed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:
    preparing a silicon carbide substrate having a first main surface and a second main surface located on a side opposite to said first main surface;
    forming an epitaxial layer on said first main surface, said epitaxial layer having a first conductivity type and having a third main surface located on a side opposite to a side on which said silicon carbide substrate is located;
    forming a trench, which includes side walls intersecting with said third main surface and a bottom portion connected to said side walls, in said epitaxial layer;
    widening an opening of said trench so that said side walls are inclined by greater than or equal to 45° and less than or equal to 80° with respect to said third main surface; and
    forming an embedded region, which has a second conductivity type different from said first conductivity type, so as to fill said trench,
    said epitaxial layer adjacent to said embedded region and said embedded region constituting a superjunction structure, the method further comprising the steps of:
    forming an impurity region having said second conductivity type on said embedded region;
    forming a first electrode on said impurity region; and
    forming a second electrode in contact with said second main surface.

2. The method for manufacturing a silicon carbide semiconductor device according to claim 1, wherein
    said embedded region is formed such that a concentration of an impurity having said second conductivity type is reduced from said bottom portion toward said opening, and
    said epitaxial layer is formed such that a concentration of an impurity having said first conductivity type increases from said first main surface toward said third main surface.

3. The method for manufacturing a silicon carbide semiconductor device according to claim 1, wherein said step of forming a trench and said step of widening an opening are performed simultaneously.

4. A method for manufacturing a silicon carbide semiconductor device, comprising the steps of:
    preparing a silicon carbide substrate having a first main surface and a second main surface located on a side opposite to said first main surface;
    forming an epitaxial layer on said first main surface, said epitaxial layer having a first conductivity type and having a third main surface located on a side opposite to a side on which said silicon carbide substrate is located;
    forming a trench, which includes side walls intersecting with said third main surface and a bottom portion connected to said side walls, in said epitaxial layer, said trench being formed to extend along a <11-20> direction when viewed in a plan view;
    widening an opening of said trench; and
    forming an embedded region, which has a second conductivity type different from said first conductivity type, so as to fill said trench,
    said epitaxial layer adjacent to said embedded region and said embedded region constituting a superjunction structure, the method further comprising the steps of:
    forming an impurity region having said second conductivity type on said embedded region;
    forming a first electrode on said impurity region; and
    forming a second electrode in contact with said second main surface.

5. The method for manufacturing a silicon carbide semiconductor device according to claim 4, wherein a plurality of trenches are formed in stripe.

* * * * *